United States Patent
Senoo et al.

(10) Patent No.: US 11,735,270 B2
(45) Date of Patent: Aug. 22, 2023

(54) SEMICONDUCTOR DEVICE AND CONTINUOUS READING METHOD

(71) Applicant: Winbond Electronics Corp., Taichung (TW)

(72) Inventors: Makoto Senoo, Kanagawa (JP);
Katsutoshi Suito, Kanagawa (JP);
Tsutomu Taniguchi, Kanagawa (JP);
Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 11 days.

(21) Appl. No.: 16/931,406

(22) Filed: Jul. 16, 2020

(65) Prior Publication Data

US 2021/0035647 A1 Feb. 4, 2021

(30) Foreign Application Priority Data

Jul. 29, 2019 (JP) .................................. 2019-138625

(51) Int. Cl.
  *G11C 16/26* (2006.01)
  *G11C 16/04* (2006.01)

(52) U.S. Cl.
  CPC .......... *G11C 16/26* (2013.01); *G11C 16/0483* (2013.01)

(58) Field of Classification Search
  CPC ..... G11C 16/26; G11C 16/0483; G11C 16/24; G11C 29/42; G06F 11/1068
  USPC .................................................. 365/185.21
  See application file for complete search history.

(56) References Cited

U.S. PATENT DOCUMENTS

| | | | |
|---|---|---|---|
| 9,013,923 B2 * | 4/2015 | Park ...................... | G11C 16/10 365/185.2 |
| 2010/0157677 A1 | 6/2010 | Furuyama | |
| 2012/0327711 A1 * | 12/2012 | Shim ...................... | G11C 16/26 365/185.03 |
| 2014/0104947 A1 | 4/2014 | Yamauchi et al. | |
| 2017/0228189 A1 * | 8/2017 | Sudo .................. | G11C 16/3459 |
| 2018/0261292 A1 * | 9/2018 | Helm ...................... | G11C 16/10 |
| 2019/0267104 A1 * | 8/2019 | Lee ......................... | G11C 16/08 |

FOREIGN PATENT DOCUMENTS

| | | |
|---|---|---|
| JP | 2001184874 | 7/2001 |
| JP | 2010146634 | 7/2010 |
| JP | 5323170 | 10/2013 |
| JP | 5667143 | 2/2015 |

(Continued)

OTHER PUBLICATIONS

Office Action of Korean Counterpart Application with English translation thereof, dated May 25, 2021, pp. 1-9.

(Continued)

*Primary Examiner* — Alfredo Bermudez Lozada
(74) *Attorney, Agent, or Firm* — JCIPRNET

(57) ABSTRACT

A continuous readout method of a flash memory is provided. Selected bit lines (BL0, BL4, BL8, and BL12) are masked by three non-selected bit lines when data of a cache memory (C0) of a selected page of a memory cell array is read. Selected bit lines (BL2, BL6, BL10, and BL14) are masked by three non-selected bit lines when data of a cache memory (C1) of the same selected page is read. In this way, each of first page data and second page data read from a plurality of selected pages is continuously outputted.

20 Claims, 22 Drawing Sheets

(56) References Cited

FOREIGN PATENT DOCUMENTS

| KR | 20150047415 | 5/2015 |
|----|-------------|--------|
| KR | 20170094479 | 8/2017 |
| KR | 20180022566 | 3/2018 |
| KR | 20180087809 | 8/2018 |

OTHER PUBLICATIONS

"Office Action of Japan Counterpart Application", dated Sep. 30, 2020, pp. 1-4.

* cited by examiner

Definition of cache memory: C0=C0_M+C0_S, C1=C1_M+C1_S

| Page buffer/sensing circuit | Sub-bit line | Global bit line (GBL_e/GBL_o) |
|---|---|---|
| PB<0> (C0) | SBL<0> | GBL<0, 3> |
| PB<4> (C1) | SBL<1> | GBL<2, 1> |
| PB<1> (C0) | SBL<2> | GBL<4, 7> |
| PB<5> (C1) | SBL<3> | GBL<6, 5> |
| PB<2> (C0) | SBL<4> | GBL<8, 11> |
| PB<6> (C1) | SBL<5> | GBL<10, 9> |
| PB<3> (C0) | SBL<6> | GBL<12, 15> |
| PB<7> (C1) | SBL<7> | GBL<14, 13> |

FIG. 9

| Y decoding table | |
|---|---|
| CA[0] | High bit group or low bit group |
| CA[3:1] | YA[7:0] |
| CA[7:4] | YB[15:0] |
| CA[11:6] | YC[10:0] |

| | | YBC* | | <*> | YA* | CA (hex) | Cache memory | SBL |
|---|---|---|---|---|---|---|---|---|
| IY1_PB_SAX16<0> | IY1_PB_SAX8<0> | 0 | IY1_PB_SA | 0 | Eb<0> | 0 | 0 | 0 |
| | | | IY1_PB_SA | 1 | Eb<1> | 2 | 0 | 2 |
| | | | IY1_PB_SA | 2 | Eb<2> | 4 | 0 | 4 |
| | | | IY1_PB_SA | 3 | Eb<3> | 6 | 0 | 6 |
| | | 68 | IY1_PB_SA | 4 | Eb<0> | 440 | 1 | 1 |
| | | | IY1_PB_SA | 5 | Eb<1> | 442 | 1 | 3 |
| | | | IY1_PB_SA | 6 | Eb<2> | 444 | 1 | 5 |
| | | | IY1_PB_SA | 7 | Eb<3> | 446 | 1 | 7 |
| | IY1_PB_SAX8<1> | 0 | IY1_PB_SA | 0 | Eb<4> | 8 | 0 | 8 |
| | | | IY1_PB_SA | 1 | Eb<5> | A | 0 | 10 |
| | | | IY1_PB_SA | 2 | Eb<6> | C | 0 | 12 |
| | | | IY1_PB_SA | 3 | Eb<7> | E | 0 | 14 |
| | | 68 | IY1_PB_SA | 4 | Eb<4> | 448 | 1 | 9 |
| | | | IY1_PB_SA | 5 | Eb<5> | 44A | 1 | 11 |
| | | | IY1_PB_SA | 6 | Eb<6> | 44C | 1 | 13 |
| | | | IY1_PB_SA | 7 | Eb<7> | 44E | 1 | 15 |
| IY1_PB_SAX16<1> | IY1_PB_SAX8<0> | 1 | IY1_PB_SA | 0 | Ob<0> | 10 | 0 | 16 |
| | | | IY1_PB_SA | 1 | Ob<1> | 12 | 0 | 18 |
| | | | IY1_PB_SA | 2 | Ob<2> | 14 | 0 | 20 |
| | | | IY1_PB_SA | 3 | Ob<3> | 16 | 0 | 22 |
| | | 69 | IY1_PB_SA | 4 | Ob<0> | 450 | 1 | 17 |
| | | | IY1_PB_SA | 5 | Ob<1> | 452 | 1 | 19 |
| | | | IY1_PB_SA | 6 | Ob<2> | 454 | 1 | 21 |
| | | | IY1_PB_SA | 7 | Ob<3> | 456 | 1 | 23 |
| | IY1_PB_SAX8<1> | 1 | IY1_PB_SA | 0 | Ob<4> | 18 | 0 | 24 |
| | | | IY1_PB_SA | 1 | Ob<5> | 1A | 0 | 26 |
| | | | IY1_PB_SA | 2 | Ob<6> | 1C | 0 | 28 |
| | | | IY1_PB_SA | 3 | Ob<7> | 1E | 0 | 30 |
| | | 69 | IY1_PB_SA | 4 | Ob<4> | 458 | 1 | 25 |
| | | | IY1_PB_SA | 5 | Ob<5> | 45A | 1 | 27 |
| | | | IY1_PB_SA | 6 | Ob<6> | 45C | 1 | 29 |
| | | | IY1_PB_SA | 7 | Ob<7> | 45E | 1 | 31 |

FIG. 11

| Cache memory C0 | SBL0 | BL0, BL3 |
|---|---|---|
| | SBL2 | BL4, BL7 |
| | SBL4 | BL8, BL11 |
| | SBL6 | BL12, BL15 |
| Cache memory C1 | SBL1 | BL1, BL2 |
| | SBL3 | BL5, BL6 |
| | SBL5 | BL9, BL10 |
| | SBL7 | BL13, BL14 |

FIG. 15A

| Reading of cache memory C0 | Selected bit lines |
|---|---|
| Reading of even-numbered pages | BL0, BL4, BL8, BL12 |
| Reading of odd-numbered pages | BL3, BL7, BL11, BL15 |

| Reading of cache memory C1 | Selected bit lines |
|---|---|
| Reading of even-numbered pages | BL2, BL6, BL10, BL14 |
| Reading of odd-numbered pages | BL1, BL5, BL9, BL13 |

FIG. 15B

| Cache memory C0 | SBL0 | BL0, BL3 |
|---|---|---|
| | SBL1 | BL1, BL2 |
| | SBL2 | BL4, BL7 |
| | SBL3 | BL5, BL6 |
| Cache memory C1 | SBL4 | BL8, BL11 |
| | SBL5 | BL9, BL10 |
| | SBL6 | BL12, BL15 |
| | SBL7 | BL13, BL14 |

FIG. 19A

| Reading of cache memory C0 | Selected bit lines |
|---|---|
| Reading of even-numbered pages | BL0, BL2, BL4, BL6 |
| Reading of odd-numbered pages | BL1, BL3, BL5, BL7 |

| Reading of cache memory C1 | Selected bit lines |
|---|---|
| Reading of even-numbered pages | BL8, BL10, BL12, BL14 |
| Reading of odd-numbered pages | BL9, BL11, BL13, BL15 |

SEMICONDUCTOR DEVICE AND CONTINUOUS READING METHOD

CROSS-REFERENCE TO RELATED APPLICATION

This application claims the priority benefit of Japan application serial no. 2019-138625, filed on Jul. 29, 2019. The entirety of the above-mentioned patent application is hereby incorporated by reference herein and made a part of this specification.

BACKGROUND

Technical Field

The disclosure relates to a semiconductor device, and particularly relates to continuous reading of a flash memory.

Description of Related Art

A NAND flash memory exhibits a continuous reading function (a burst reading function) capable of continuously reading multiple pages in response to an external command. A page buffer/sensing circuit includes, for example, two latches. In a continuous reading operation, when data read from an array is held in one latch, data held by the other latch may be outputted (for example, patent literatures 1, 2, 3, etc.).

Patent literature 1: Japan Patent No. 5323170
Patent literature 2: Japan Patent No. 5667143
Patent literature 2: U.S. Patent Application US 2014/0104947A1

Problems to be solved by the disclosure includes the following.

FIG. 1A and FIG. 1B illustrate a schematic configuration of a NAND flash memory equipped with a chip-level error checking and correction (ECC) function. The flash memory includes: a memory cell array 10 including a NAND string, a page buffer/sensing circuit 20, a data transmission circuit 30, a data transmission circuit 32, and an error detection and correction circuit (which is referred to as an ECC circuit hereinafter) 40, and an input output circuit 50. The page buffer/sensing circuit 20 includes two latches L1 and L2 (one latch, for example, has 4 KB) holding read data or input data to be programmed, and the latch L1 and the latch L2 respectively include a cache memory C0 and a cache memory C1 (one cache memory, for example, has 2 KB). The cache memory C0 and the cache memory C1 may respectively perform independent operations. In addition, the ECC circuit 40 may be enabled or disabled through user options.

FIG. 2 is a timing diagram of conventional continuous reading. The continuous reading is to continuously read data from multiple pages, and such operation may be executed through commands. First, array reading of a page P0 (page 0) is performed. At this moment, a reading time tRD1 is about 24 μs. The data of the read page PO is held in the cache memory C0 and the cache memory C1 (P0C0, P0C1) of the latch L1 (latch 1). Then, the data of the cache memory C0 and the cache memory C1 of the latch L1 is transmitted to the cache memory C0 and the cache memory C1 of the latch L2 (latch 2). During a period when one of the cache memory C0 and the cache memory C1 performs data output, the other one performs ECC processing, and during a period when the other one performs data output, the one performs the ECC processing. Moreover, after data is transmitted from the latch L1 to the latch L2, array reading of a next page P1 (page 1) is performed and the read data is held in the latch L1.

In the continuous reading, a row address is automatically and progressively increased, and continuous reading of a plurality of pages is started from the page P1. An array reading time tR in the continuous reading is about 18 us. The array reading is performed in synchronization with an internal clock signal, and data output of the input output circuit 50 is performed in synchronization with an external clock signal ExCLK which is asynchronous with the internal clock signal. A data output time tDOUT of one page depends on a frequency of the external clock signal ExCLK. For example, when the external clock signal ExCLK is 104 MHz, the data output time tDOUT is about 39.4 μs. In the continuous reading, the array reading time tR must be less than the data output time tDOUT of one page.

The memory cell array 10 includes a main region for storing data, and a spare region for storing error detection codes generated by ECC processing and user information, etc. FIG. 1B shows the main region and the spare region of the memory cell array 10. The main region includes a main part C0_M corresponding to the cache memory C0 and a main part C1_M corresponding to the cache memory C1, a column address of the main part C0_M is 000h-3FFh, and a column address of the main part C1_M is 400h-7FFh. The spare region includes a spare part C0_S corresponding to the cache memory C0 and a spare part C1_S corresponding to the cache memory C1, a column address of the spare part C0_S is 800h-83Fh, and a column address of the spare part C1_S is 840h-87Fh.

The cache memory C0 and the cache memory C1 used by a user are defined by C0=the main part 0_M+the spare part C0_s, C1=the main part C1_M+the spare part C1_S. This user definition is the same as a definition of the flash memory in internal operations. Moreover, the column addresses of the memory cell array are the same as and correspond to the column addresses of the latches L1 and L2 of the page buffer/sensing circuit 20 one-to-one. Moreover, in the continuous reading operation, the data is sequentially output in an order from the column address 000h to the column address 87Fh.

When a size of one page becomes larger due to high integration, a dedicated area of the page buffer/sensing circuit 20 is enlarged proportionally. If the latch L2 may be removed, the area occupied by the page buffer/sensing circuit 20 may be greatly reduced. FIG. 3 is a timing diagram of continuous reading performed by using the single latch L1 (without the latch L2). In this case, since there is no place to evacuate the data of the latch L1, if the data of the latch L1 is not empty, the array reading cannot be performed. That is, it is actually impossible to perform seamless reading.

Therefore, it is studied to divide data of one page into two ½ pages of the cache memory C0 and the cache memory C1 for reading. In this case, a same page is read twice, so that there may be an interference caused by the reading operation. Namely, in the reading operation, since all of bit lines are precharged/discharged, an undesirable voltage caused by capacitive coupling between the bit lines may affect the bit lines and the memory cells.

FIG. 4 is a timing diagram of performing reading of ½ pages of the cache memory C0 and the cache memory C1 (twice array reading) in a continuous reading operation. When the cache memory C0 of a selected page of the memory cell array is read, as shown in FIG. 1B, the main part C0_M and the spare part C0_S are read, and the data is transmitted to the latch L1, and when the cache memory C1 is read, the main part C1_M and the spare part C1_S are read, and the data is transmitted to the latch L1.

Therefore, data transmission of the cache memory C0 of the next page P1 must be after the output of the cache memory C0 of the page P0 of the latch L1. If the data transmission of the cache memory C0 of the page P1 is performed before that, the cache memory C0 of the page P0 is overwritten. The data output of the cache memory C0 is completed when the spare part C0_S of the cache memory C0 is output, in other word, if the data transmission of the cache memory C0 of the page P1 is not performed in the data output of the spare part C1_S of the cache memory C1, it is unable to output the data of the page P1 seamlessly. However, a data output time tDOUT_C1Sp of the spare part C1_S of the cache memory C1 is about 1.2 μs, and in such a short period, in order to carry out the data transmission of the cache memory C0 of the next page, strict timing adjustment is required, which is difficult to achieve.

SUMMARY

The disclosure is directed to a semiconductor device and a continuous reading method capable of performing continuous reading with high reliability while reducing a scale of a page buffer/sensing circuit.

The disclosure provides a continuous reading method of a flash memory, and the method includes the following steps. When first page data of a first page of a memory cell array is read, two or more non-selected bit lines connected to a ground level are provided between selected bit lines, and when second page data of the first page of the memory cell array is read, two or more non-selected bit lines connected to the ground level are provided between the selected bit lines. As such, each of the first page data and the second page data read out from a plurality of selected pages is continuously outputted.

The disclosure provides a semiconductor device including: a memory cell array; a page buffer/sensing circuit connected to each of bit lines of the memory cell array; a reading component reading a selected page of the memory cell array; and an output component, outputting data read by the reading component. When the reading component performs continuous reading of a plurality of pages and when first page data of the selected page of the memory cell array is read, two or more non-selected bit lines connected to a ground level are provided between selected bit lines. When second page data of the selected page of the memory cell array is read, two or more non-selected bit lines connected to the ground level are provided between the selected bit lines.

According to the disclosure, when the first page data of the first page of the memory cell array is read, a plurality of non-selected bit lines are used to mask the selected bit lines. When the second page data of the first page of the memory cell array is read, a plurality of non-selected bit lines are used to mask the selected bit lines. In this way, in the continuous reading operation, a reading interference occurred when the same page is read multiple times is suppressed, highly reliable reading is thereby provided and a circuit scale of the page buffer/sensing circuit is reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 9 is a diagram of selection performed by the page buffers/sensing circuits in a row direction when the cache memory C0 and the cache memory C1 are read according to an embodiment of the disclosure.

FIG. 11 is a table of the selected page buffers/sensing circuits when the cache memory C0 and the cache memory C1 are read according to an embodiment of the disclosure.

FIG. 15A is a diagram showing a connection relationship between sub-bit lines SBL and bit lines shown in FIG. 14, and FIG. 15B is a diagram showing the bit lines selected when the cache memory C0 and the cache memory C1 are read.

FIG. 19A is a diagram showing a connection relationship between the sub-bit lines SBL and the bit lines of the comparative example, and FIG. 19B is a diagram showing the bit lines selected when the cache memory C0 and the cache memory C1 are read.

FIG. 21 is a diagram of selection performed by the page buffers/sensing circuits in the row direction when the cache memory C0 and the cache memory C1 are read according to the comparative example.

DESCRIPTION OF THE EMBODIMENTS

The embodiments of the disclosure will be described in detail with reference to the drawings. The semiconductor device of the disclosure is, for example, a NAND flash memory or a microprocessor, a microcontroller, a logic, an application specific integrated circuits (ASIC), a processor adapted to process images or sound, or a processor adapted to process signals such as wireless signals, etc., that is embedded in such flash memory.

Figure 5:
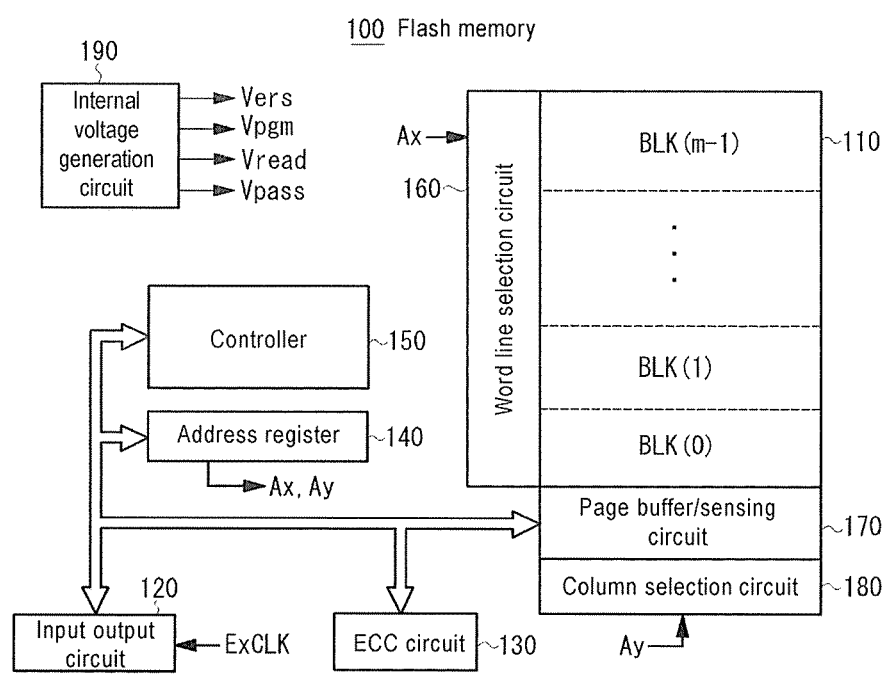
FIG. 5 is a diagram showing a configuration of a flash memory according to an embodiment of the disclosure.

FIG. 5 is a diagram showing a configuration of a flash memory according to an embodiment of the disclosure. A flash memory 100 of the embodiment includes: a memory cell array 110, having a plurality of memory cells arranged in a matrix; an input output circuit 120, adapted to output data to the outside or input data input from the outside in response to an external clock signal ExCLK; an ECC circuit 130, adapted to perform error detection and correction of data; an address register 140, receiving address data through the input output circuit 120; a controller 150, controlling each part based on a command received through the input output circuit 120 or a control signal applied to an external terminal; a word line selection circuit 160, receiving row address information Ax from the address register 140, decoding the row address information Ax, and performing block selection and word line selection, etc., based on a decoding result; a page buffer/sensing circuit 170, holding data read from a page selected by the word line selection circuit 160 or holding data to be programmed to the selected page; a column selection circuit 180, receiving column address information Ay from the address register 140, decoding the column address information Ay, and performing row selection in the page buffer/sensing circuit 170 based on a decoding result; and an internal voltage generation circuit 190, generating various voltages (a programming voltage Vpgm, a pass voltage Vpass, a reading pass voltage Vread, an erasing voltage Vers, etc.) required for reading, programming, erasing, etc., of data.

The memory cell array 110, for example, has m memory blocks BLK(0), BLK(1), . . . , BLK(m-1) arranged in a column direction. A plurality of NAND strings are formed in one memory block, and the NAND strings are formed by connecting a plurality of memory cells in series. The NAND strings may be formed on a substrate surface either in a two-dimensional manner or a three-dimensional manner. Moreover, the memory cell may be either a single level cell (SLC) type storing one bit (binary data) or a multi level cell (MLC) type storing multiple bits. One NAND string is formed by serially connecting a plurality of memory cells (for example, 64 memory cells), a bit line side selection transistor (selection gate line), and a source line side selection transistor (selection gate line). A drain of the bit line side selection transistor is connected to a corresponding bit line GBL, and a source of the source line side selection transistor is connected to a common source line.

In a reading operation of the flash memory 100, a certain positive voltage is applied to the bit lines, a certain voltage (for example, 0 V) is applied to the selected word line, a pass voltage Vpass (for example, 4.5 V) is applied to the non-selected word lines, and a positive voltage (for example, 4.5 V) is applied to the selection gate line and the selection gate line to turn on the bit line side selection transistor and the source line side selection transistor of the NAND string, and 0 V is applied to the common source line. In a programming (writing) operation, a high-voltage programming voltage Vpgm (15 V to 20 V) is applied to the selected word line, and an intermediate potential (for example, 10 V) is applied to the non-selected word lines to turn on the bit line side selection transistor and turn off the source line side selection transistor, and a potential corresponding to data "0" or "1" is supplied to the bit lines. In an erasing operation, 0 V is applied to the selected word line in the block, and a high voltage (for example, 20 V) is applied to a P-well (well) to extract electrons of a floating gate to the substrate, so as to erase data in a unit of block.

Figure 1A:
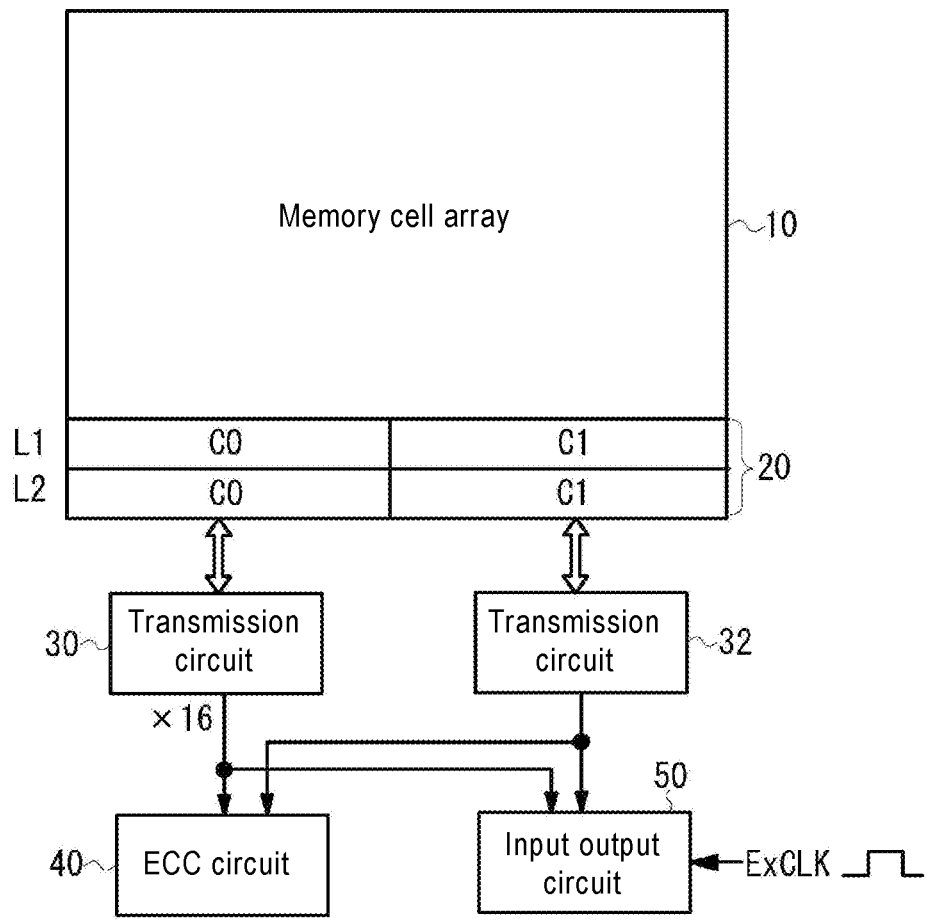
FIG. 1A and FIG. 1B are diagrams of a schematic configuration of a conventional NAND flash memory.
Figure 1B:
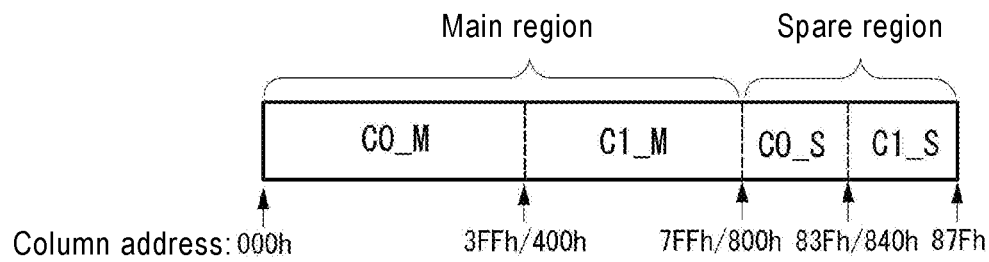
Figure 2:
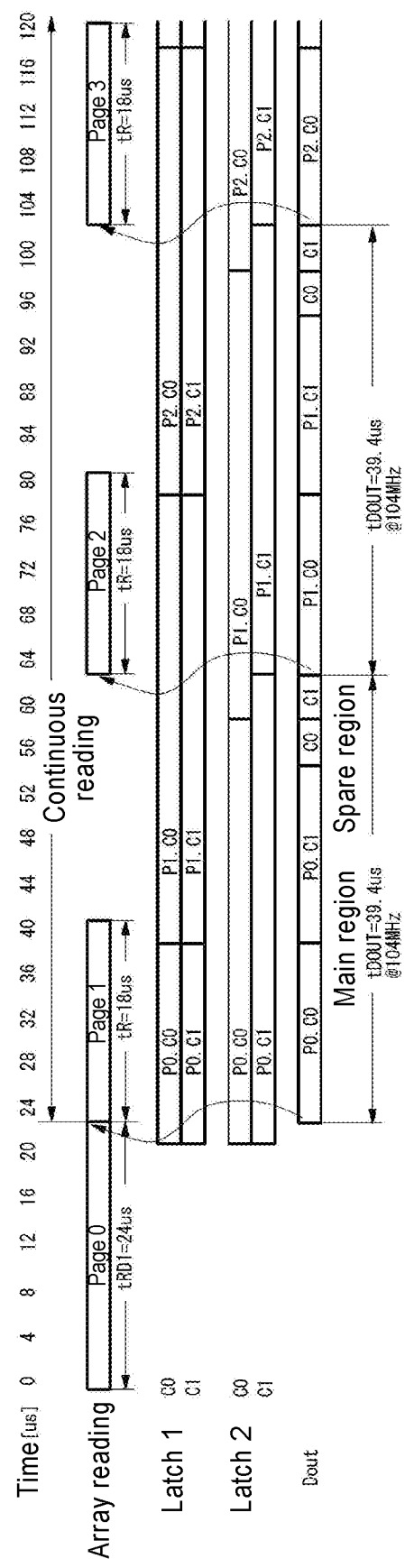
FIG. 2 is a timing diagram of conventional continuous reading performed by using a latch L1 and a latch L2.
Figure 3:
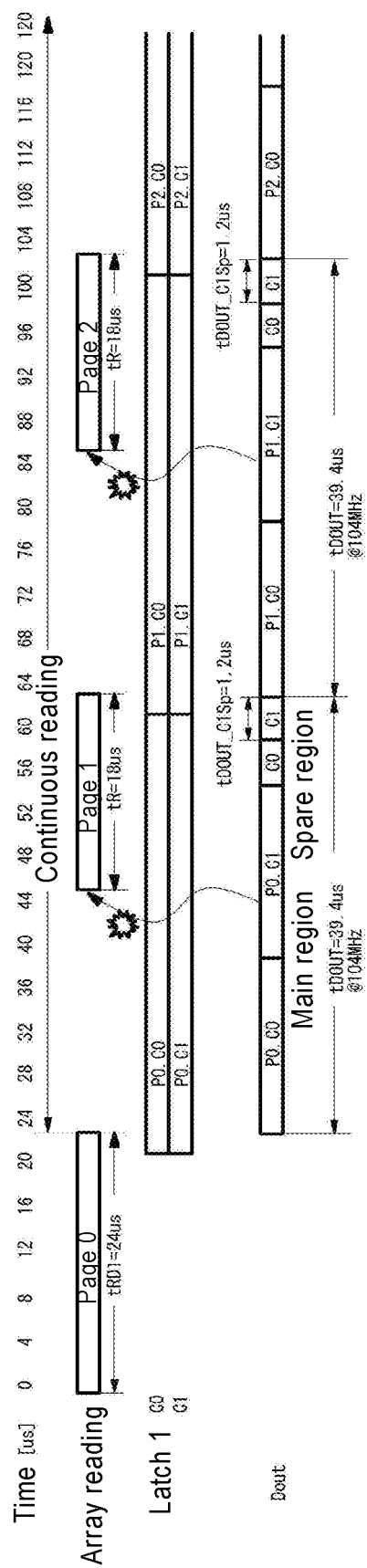
FIG. 3 is a timing diagram of conventional continuous reading performed by using the single latch L1.
Figure 4:
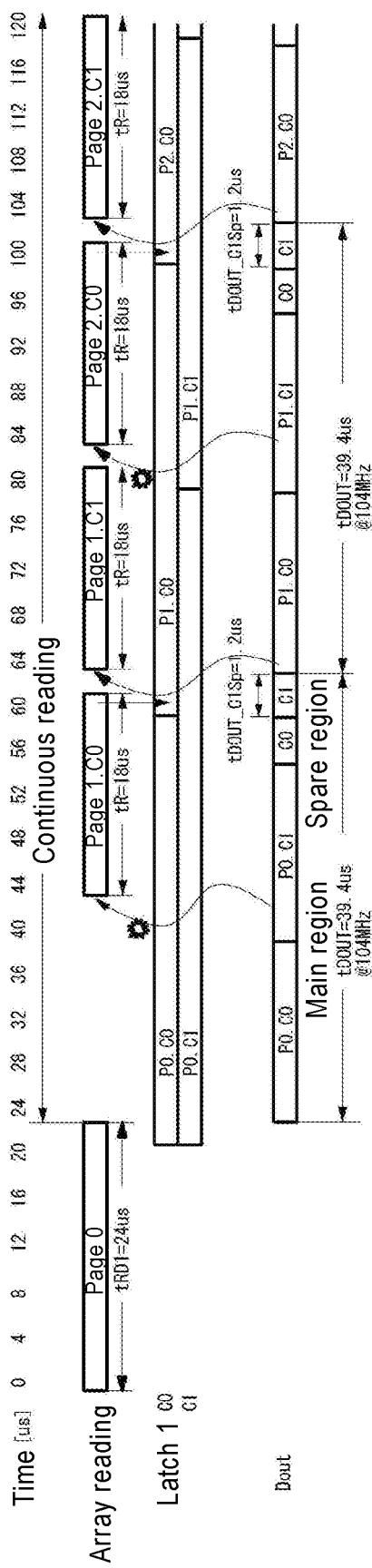
FIG. 4 is a timing diagram of another conventional continuous reading performed by using the latch L1.
Figure 6A:
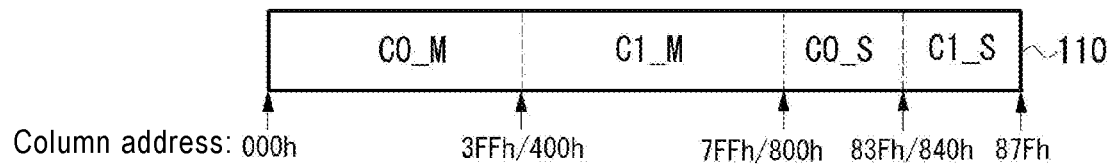
FIG. 6A and FIG. 6B are diagrams explaining definitions of a cache memory CO and a cache memory C1 according to an embodiment of the disclosure.
Figure 6B:
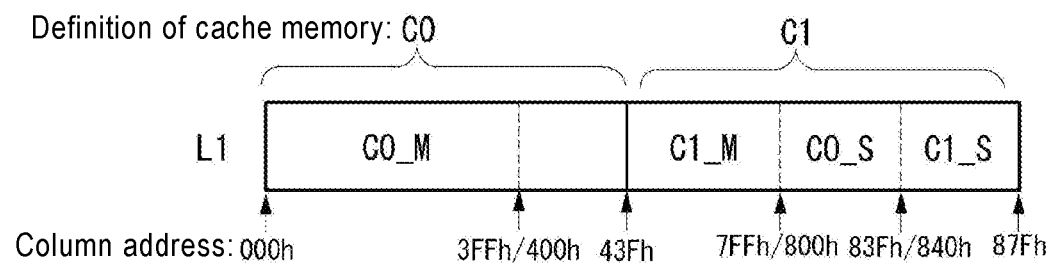

The page buffer/sensing circuit 170 includes a single latch L1 other than including two latches L1 and L2 as shown in FIG. 1A and FIG. 1B. In addition, it should be noted that in an internal operation of the flash memory 100, a cache memory C0 and a cache memory C1 are defined by ½ pages of continuous column addresses. FIG. 6A illustrates a configuration of a main region and a spare region on the memory cell array, and FIG. 6B illustrates definitions of the internal cache memory C0 and the cache memory C1.

The main region includes a main part C0_M corresponding to the cache memory C0 and a main part C1_M corresponding to the cache memory C1, column addresses of the main part C0_M are 000h-3FFh, and column addresses of the main part C1_M are 400h-7FFh. The spare region includes a spare part C0_S corresponding to the cache memory C0 and a spare part C1_S corresponding to the cache memory C1, column addresses of the spare part 0_S are 800h-83Fh, and column addresses of the spare part C1_S are 840h-87Fh.

In the internal operation of the flash memory 100, the cache memory C0 is defined as column addresses 000h-43Fh, and the cache memory C1 is defined as column addresses 440h-87Fh. Therefore, the cache memory C0 includes the main part C0_M and a part of the main part C1_M. The cache memory C1 includes a part of the main part C1_M, the spare part C0_S and the spare part C1_S. On the other hand, in terms of user definition, the cache memory C0 includes the main part C0_M and the spare part C0_S, and the cache memory C1 includes the main part C1_M and the spare part C1_S.

The data read from the selected page of the memory cell array is sensed by a sensing node of the page buffer/sensing circuit 170, and the sensed data is transmitted to the latch L1 and held by the latch L1. In the continuous reading operation, reading of the same page is performed twice, where the data of the cache memory C0 is read first, and is transmitted to the column addresses 000h-43Fh of the latch L1, and then the data of the cache memory C1 is read, and is transmitted to the column addresses 440h-87Fh of the latch L1. The cache memory C0 and the cache memory C1 of the latch L1 may respectively perform independent operations. Namely, in the continuous reading operation, reading from the array and output of data are independently performed in a unit of ½ pages. The array reading is performed based on an internal clock signal, and the data transmission between the latch L1 and the input output circuit 120 and the data output from the input output circuit 120 are performed based on the external clock signal ExCLK.

The column selection circuit 180 selects a start reading position of data in a page according to the input column address information Ay, or automatically reads the data from the beginning of the page without using the column address. Furthermore, the column selection circuit 180 may include a column address counter that increases the column address in response to a clock signal.

Figure 7:
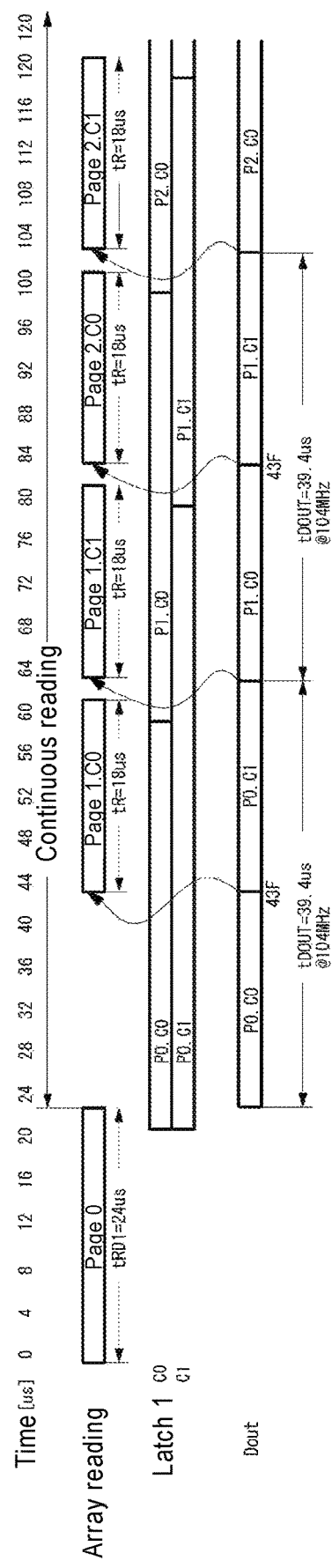
FIG. 7 is a timing diagram of a continuous reading operation according to an embodiment of the disclosure.

Next, the continuous reading operation of the flash memory 100 of the embodiment is described below. For example, the continuous reading operation is performed in a flash memory equipped with a serial peripheral interface (SPI) function. FIG. 7 is a timing diagram of the continuous reading operation of the embodiment. As shown in FIG. 7, after data of the cache memory C0 of a page P0 is output, in the data output of the cache memory C1 of the page P0, array reading of the cache memory C0 of the next page P1 is performed, and the read data of the cache memory C0 is transmitted to the latch L1. When the output of the data held in the latch L1 reaches the column address 43F, the controller 150 starts the array reading of the cache memory C0.

Then, after data of the cache memory C1 of the page P0 is output, in the data output of the cache memory C0 of the page P1, the page 1 is again selected to transmit the data of the cache memory C1 of the page P1 to the latch L1. When the output of the data held in the latch L1 reaches the column address 87F, the controller 150 starts the array reading of the cache memory C1.

In this way, in the embodiment, in the output of the cache memory C1 of the latch L1, the data of the cache memory C0 of the next page is read to the latch L1, and in the output of the cache memory C0, the data of the cache memory C1 of the next page is read to the latch L1, so that even if the high frequency external clock signal ExCLK is used, it is easy to satisfy that the data output time tDOUT of the cache memory of ½ page is greater than the array reading time tR of ½ page, so that seamless data output of multiple pages may be performed.

Figures 8A, 8B:
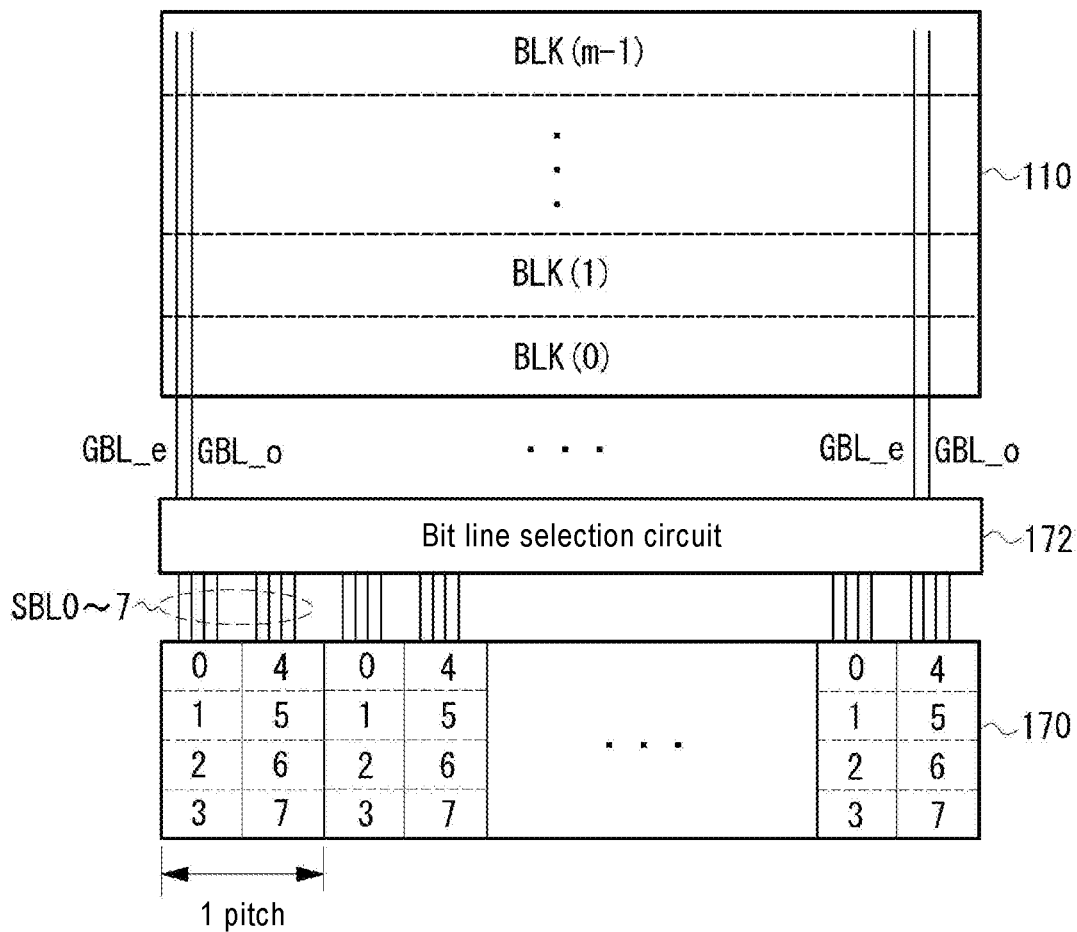
FIG. 8A and FIG. 8B are diagrams showing a layout of page buffers/sensing circuits according to an embodiment of the disclosure.

Next, FIG. 8A is a schematic diagram of a layout of the page buffer/sensing circuit 170 of the embodiment. FIG. 8B is a table showing a connection relationship of page buffers/sensing circuits PB<0> to <7>, sub-bit lines SBL<0> to <7>, and global bit lines GBL<0> to <15>. As shown in FIG. 8A, the page buffers/sensing circuits 170 are configured in 2-column×4-segment within one pitch of a row direction. One page buffer/sensing circuit is composed of a sensing circuit and a latch circuit. A sub-bit line SBL connected to a sensing node of a page buffer/sensing circuit is connected to an even-numbered global bit line GBL_e and an odd-numbered global bit line GBL_o through a bit line selection circuit 172. The even-numbered global bit lines GBL_e and the odd-numbered global bit lines GBL_o extend in the column direction on a plurality of blocks of the memory cell array 110. Therefore, within one pitch, 8 sub-bit lines are laid out, and 8 page buffers/sensing circuits 170 connected to the 8 sub-bit lines are configured, where the 8 sub-bit lines are connected to 16 even-numbered global bit lines GBL_e and odd-numbered global bit lines GBL_o through the bit line selection circuit 172. By arranging the page buffers/sensing circuits into 2-column×4-segment, the number of segments of the page buffer/sensing circuit 170 in the column direction is reduced, so that area efficiency is improved. Further, in the embodiment, since the page buffer/sensing circuit 170 does not include a plurality of the latches L1 and L2, a size thereof in a height direction may be reduced. Moreover, in the continuous reading operation, when the cache memory C0 is read, any one of the even-numbered global bit lines GBL_e or the odd-numbered global bit lines GBL_o corresponding to the sub-bit lines SBL<0, 2, 4, 6> connected to the page buffers/sensing circuits PB<0> to <3> is read, and when the cache memory C1 is read, any one of the even-numbered global bit lines GBL_e or the odd-numbered global bit lines GBL_o corresponding to the sub-bit lines SBL<1, 3, 5, 7> connected to the page buffers/sensing circuits PB<4> to <7> is read. At this time, the non-selected even global bit lines or odd global bit lines are electrically connected to GND to perform mask reading.

Figure 9:
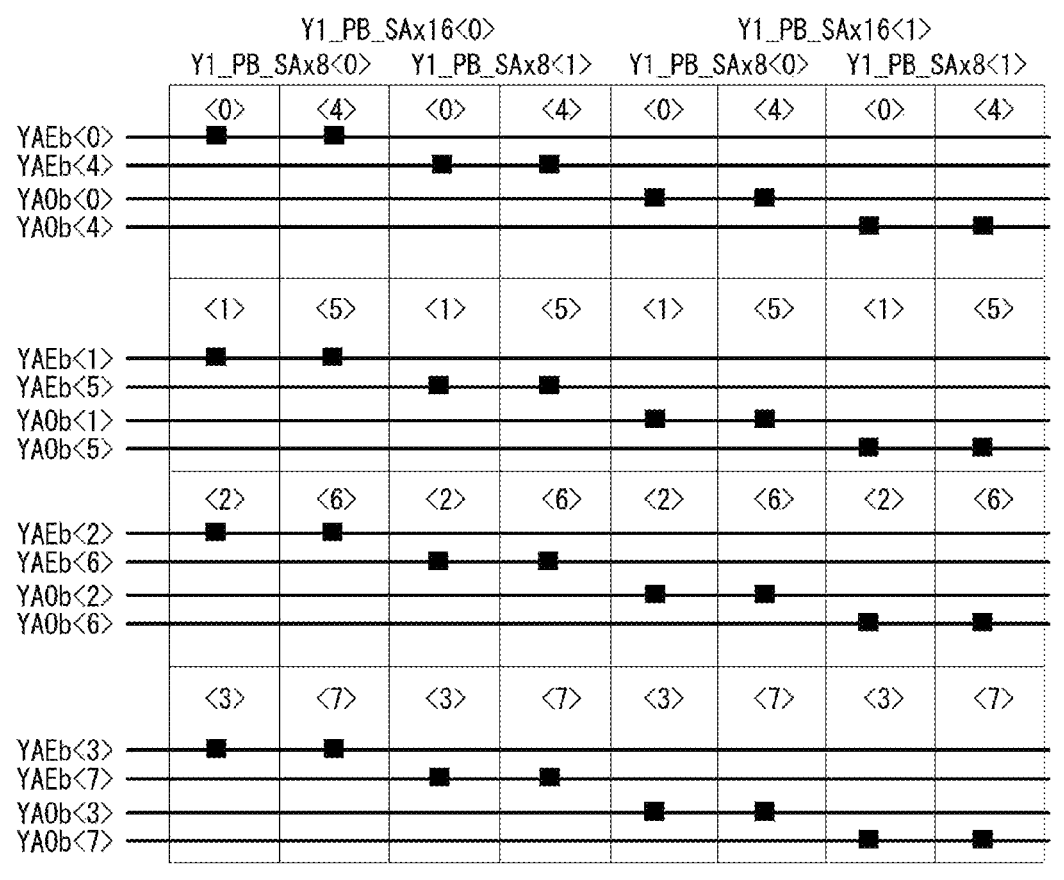
Figures 10A, 10B:
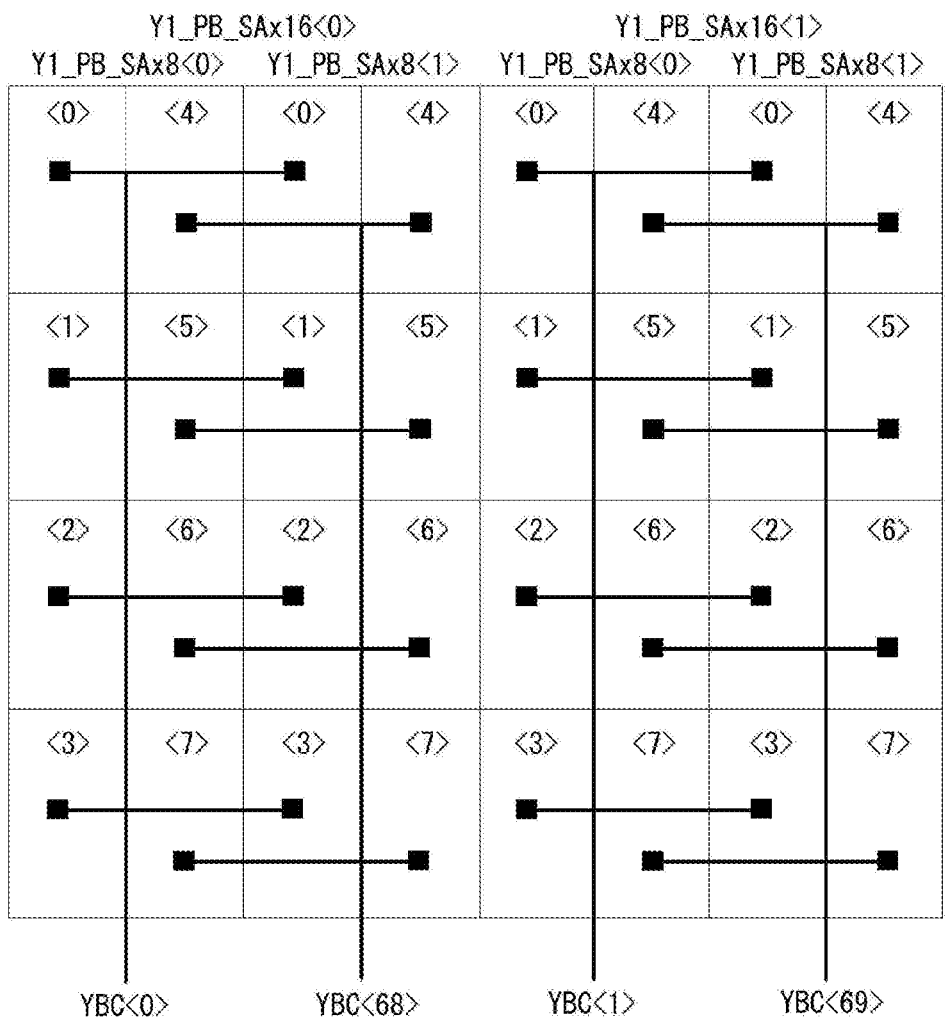
FIG. 10A and FIG. 10B are diagrams of selection performed by the page buffers/sensing circuits in a column direction when the cache memory C0 and the cache memory C1 are read according to an embodiment of the disclosure.

FIG. 9, FIG. 10A and FIG. 10B, FIG. 11 respectively show a connection relationship between the cache memory C0, the cache memory C1, and the page buffers/sensing circuits (global bit lines) shown in FIG. 8A and FIG. 8B. In the figures, Y1_PB_SA×8<0> and Y1_PB_SA×8<1> represent layouts of eight page buffers/sensing circuits. A YAEb<*> signal, a YAOb<*> signal, and a YBC<*> signal are selection signals generated by decoding column addresses by the column selection circuit 180. FIG. 10A shows a decoding table of the column address CA. The column addresses CA[3:1], CA[7:4], and CA[11:6] are decoded as YA[3:1], YA[15:0], and YA[10:0], respectively.

When reading of the cache memory C0 and the cache memory C1 is performed, the corresponding page buffer/sensing circuit 170 is selected by YBC<*>. In FIG. 10B, YBC<0> to YBC<67> select the page buffers/sensing circuits PB<0> to <3> in reading of the cache memory C0, and YBC<68> to YBC<135> select the page buffers/sensing circuits PB<4> to <7> in reading of the cache memory C1. YBC[0, 68], YBC[1, 69], . . . YBC[67, 135] are cache memory C0 and cache memory C1 pairs in the page buffers/sensing circuits of Y1_PB_SA×8. In this way, in the reading operation of the cache memory C0 and the cache memory C1, by alternately arranging the activated page buffers/sensing circuits in the column direction and the non-activated page buffers/sensing circuits in the row direction, the physically separated cache memory C0 and cache memory C1 shown in FIG. 6B are connected, and since the activated page buffers/sensing circuits are physically separated (due to intervening of the non-activated page buffers/sensing circuits), the bit lines selected at the same time in the cache memory C0 or the cache memory C1 may be separated, thereby suppressing an influence of capacitive coupling occurred between the page buffers/sensing circuits and between the bit lines when a same page is repeatedly read.

Figure 12:
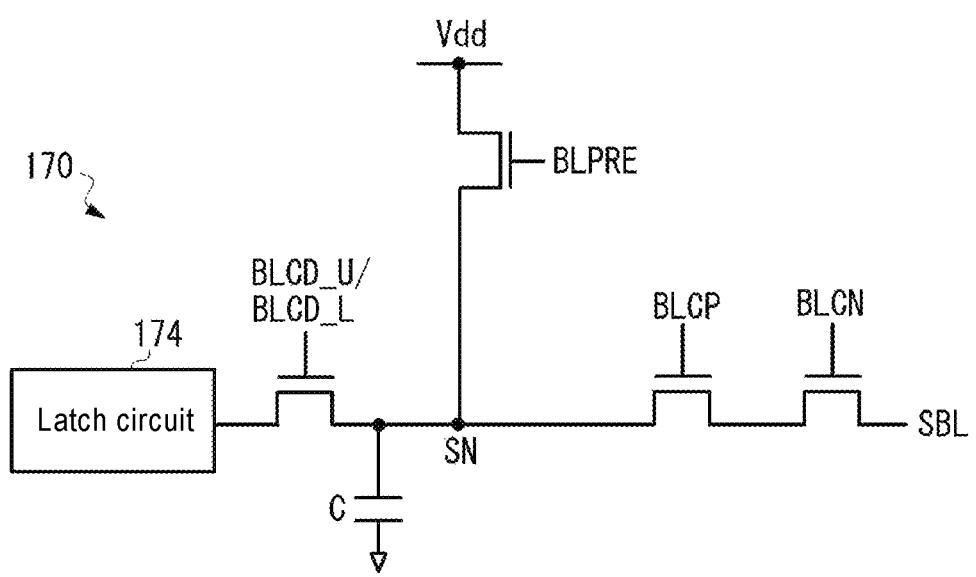
FIG. 12 is a diagram of an example of a page buffer/sensing circuit of the flash memory according to an embodiment of the disclosure.

Then, a specific method of suppressing reading interference in the continuous reading operation of the embodiment is described below. FIG. 12 is a diagram showing a configuration of the page buffer/sensing circuit 170 of the embodiment. As shown in FIG. 12, one page buffer/sensing circuit 170 is connected to an even-numbered bit line and an odd-numbered bit line through a bit line selection circuit, i.e., one page buffer/sensing circuit 170 is shared by the two bit lines of the even-numbered bit line and the odd-numbered bit line.

As described above, the page buffer/sensing circuit 170 is selectively driven in the reading operation of the cache memory C0 and the cache memory C1. Therefore, the page buffer/sensing circuit 170 has two types, one is enabled when the cache memory C0 is cached, and one is enabled when the cache memory C1 is cached. In the following description, "_U" added at an end of a reference symbol indicates that it belongs to the cache memory C0, and "_L" indicates that it belongs to the cache memory C1.

The page buffer/sensing circuit 170 includes a latch circuit 174, and the latch circuit 174 holds data read from a selected memory cell or holds data to be programmed into the selected memory cell. The latch circuits 174 of all of page buffers/sensing circuits 170 construct the latch L1 corresponding to one page. The latch circuit 174 is connected to a sensing node SN via a transistor BLCD_U/BLCD_L used for charge transfer. A transistor BLPRE used for pre-charging a bit line is connected to the sensing node SN. Furthermore, the sensing node SN includes a transistor BLCN used for connecting a sub-bit line, and a transistor BLCP used for clamping a potential of the bit line.

Figure 13:
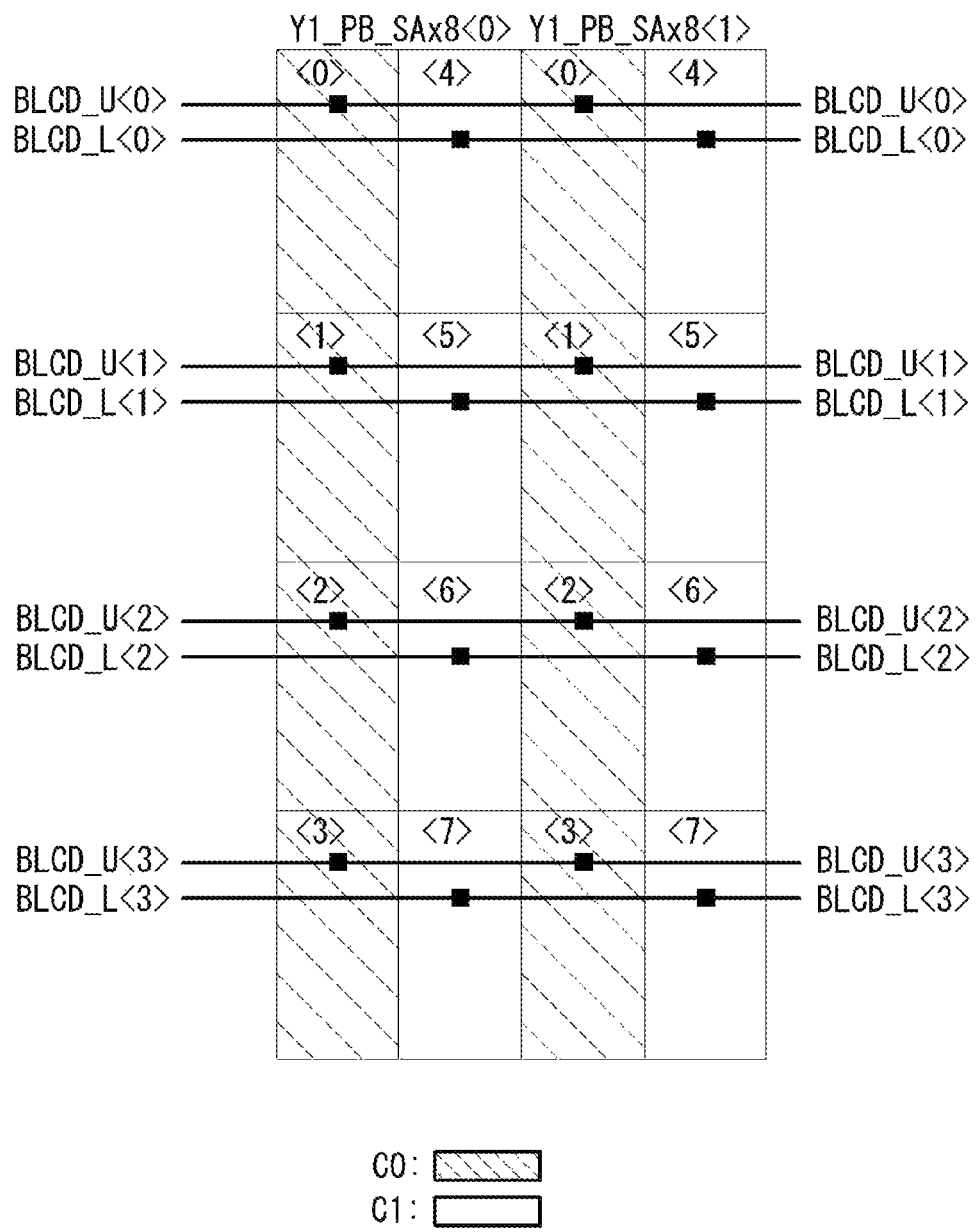
FIG. 13 is a diagram showing a connection relationship between page buffers/sensing circuits and wires used for driving transistors BLCD_U/BLCD_L according to an embodiment of the disclosure.

FIG. 13 illustrates a connection relationship between the page buffers/sensing circuits 170 of the embodiment and wires used for driving the transistors BLCD_U/BLCD_L. The page buffers/sensing circuits 170 are arranged in 2-column×4-segment within a pitch, and these eight page buffers/sensing circuits 170 are repeatedly arranged in the row direction. BLCD_U is connected to the page buffer/sensing circuit <0>, the page buffer/sensing circuit <1>, the page buffer/sensing circuit <2>, and the page buffer/sensing circuit <3> selected when the cache memory C0 is read, BLCD_L is connected to the page buffer/sensing circuit <4>, the page buffer/sensing circuit <5>, the page buffer/sensing circuit <6>, and the page buffer/sensing circuit <7> selected when the cache memory C1 is read.

Figure 14:
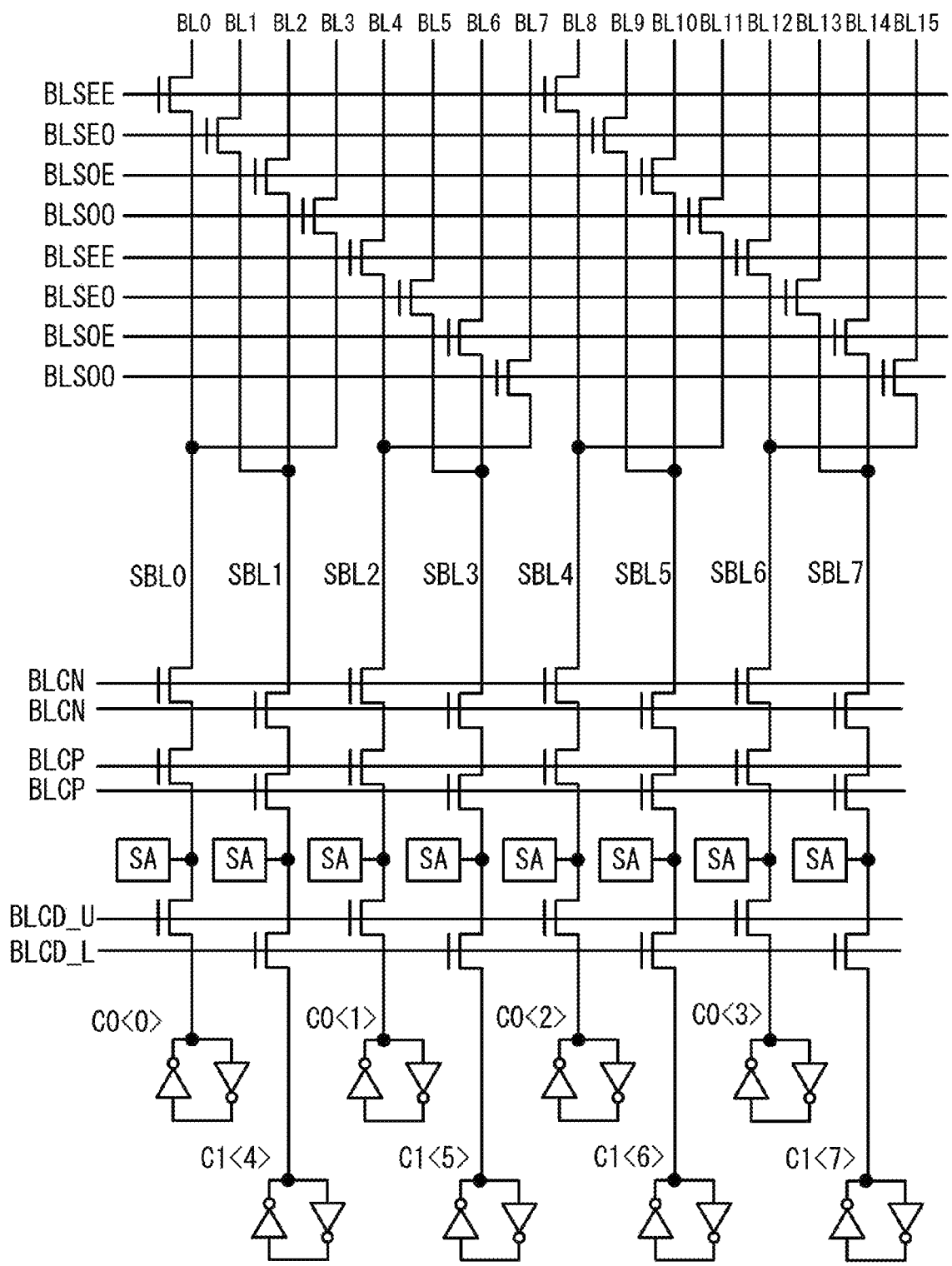
FIG. 14 is a diagram showing an electrical connection relationship between page buffers/sensing circuits and bit lines according to an embodiment of the disclosure.

FIG. 14 is a diagram showing an electrical connection relationship between the page buffers/sensing circuits and the bit lines in the embodiment. FIG. 15A shows a connection relationship between the sub-bit lines SBL and the bit lines shown in FIG. 14, and FIG. 15B shows the bit lines selected when the cache memory C0 and the cache memory C1 are read. Moreover, the bit line BL0 to the bit line BL15 correspond to the global bit lines GBL_e/GBL_o shown in FIG. 8A and FIG. 8B. In addition, C0<0>, C0<1>, C0<2>, and C0<3> shown in FIG. 14 represent the page buffers/sensing circuits selected when the cache memory C0 is read, and C1<4>, C1<5>, C1<6>, and C1<7> represent the page buffers/sensing circuits selected when the cache memory C1 is read.

As shown in FIG. 14, the page buffer/sensing circuit <0> is connected to the sub-bit line SBL0 through the transistor BLCD_U, the transistor BLCP, and the transistor BLCN. The sub-bit line SBL0 is connected to the even-numbered bit line BL0 and the odd-numbered bit line BL3 through the bit line selection circuit 172 (referring to FIG. 8A and FIG. 8B). The page buffer/sensing circuit <4> adjacent to the page buffer/sensing circuit <0> in physical layout is connected to the sub-bit line SBL1 through the transistor BLCD_L, the transistor BLCP, and the transistor BLCN. The sub-bit line SBL1 is connected to the even-numbered bit line BL2 and the odd-numbered bit line BL1 through the bit line selection circuit 172. The above relationship is the same in the page buffer/sensing circuit <1> and the page buffer/sensing circuit <5>, the page buffer/sensing circuit <2> and the page buffer/sensing circuit <6>, and the page buffer/sensing circuit <3> and the page buffer/sensing circuit <7>.

Figure 16:
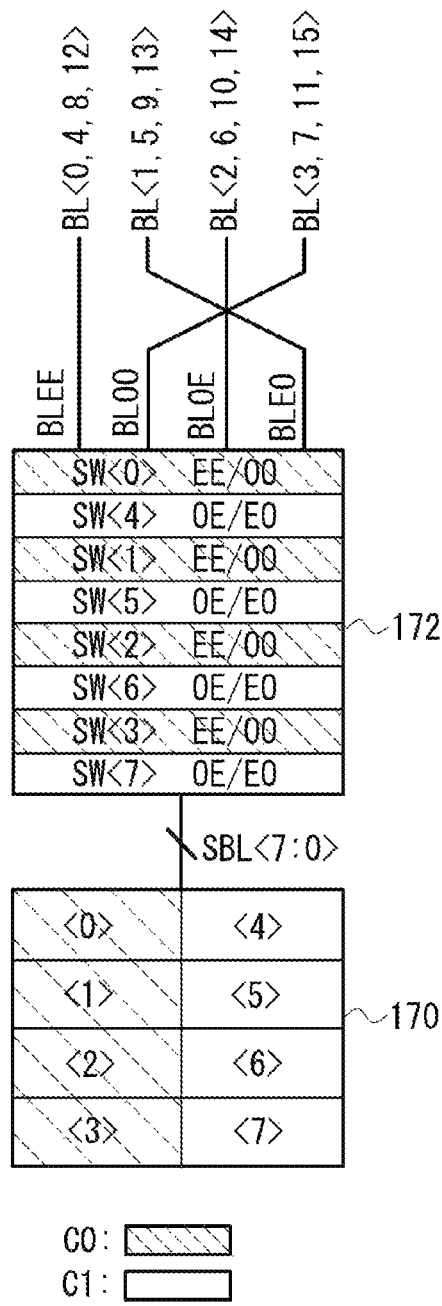
FIG. 16 is a diagram showing a connection relationship between sub-bit lines and each switch (selected transistor) of a bit line selection circuit according to an embodiment of the disclosure.

FIG. 16 is a diagram showing a connection relationship between sub-bit lines and each switch (selected transistor) of the bit line selection circuit 172. The page buffer/sensing circuit <0> is connected to the switch SW <0> through the sub-bit line SBL0. The switch SW<0> is a transistor BLSEE and a transistor BLSOO connected to the bit line BL0 and the bit line BL3 shown in FIG. 14. The page buffer/sensing circuit <4> is connected to the switch SW <4> through the sub-bit line SBL1. The switch SW<4> is a transistor BLSEO and a transistor BLSOE connected to the bit line BL1 and the bit line BL2 shown in FIG. 14. Other page buffer/sensing circuit <1>, the page buffer/sensing circuit <5>, the page buffer/sensing circuit <2>, the page buffer/sensing circuit <6>, the page buffer/sensing circuit <3> and the page buffer/sensing circuit <7> are similarly connected to the switch SW<1>, the switch SW<5>, the switch SW<2>, the switch SW<6>, the switch SW<3>, and the switch SW<7> of the bit line selection circuit 172, respectively.

The bit line selection circuit 172 selectively turns on the transistor BLSEE when reading the even-numbered pages of the cache memory C0, and selectively turns on the transistor BLSOO when reading the odd-numbered pages of the cache memory C0, and selectively turns on the transistor BLSOE when reading the even-numbered pages of the cache memory C1, and selectively turns on the transistor BLSEO when reading the odd-numbered pages of the cache memory C1.

Therefore, as shown in FIG. 15B, when the even-numbered pages of the cache memory C0 are read, the bit line BL0, the bit line BL4, the bit line BL8, and the bit line BL12 are selected, and when the odd-numbered pages are read, the bit line BL3, the bit line BL7, the bit line BL11, and the bit line BL15 are selected; when the even-numbered pages of the cache memory C1 are read, the bit line BL2, the bit line BL6, the bit line BL10, and the bit line BL14 are selected, and when the odd-numbered number pages of the cache memory C1 are read, the bit line BL1, the bit line BL5, the bit line BL9, and the bit line BL13 are selected. The non-selected bit lines are electrically connected to the GND level through a virtual power supply of the bit line selection circuit 172.

According to the embodiment, when the cache memory C0 and the cache memory C1 are read, bit lines spaced apart by every three bit lines are selected, in other words, three non-selected bit lines connected to the GND level are provided between the selected bit lines, so that floating gate (FG) coupling between the bit lines may be effectively suppressed. Therefore, in the continuous reading operation, even if the same page is read twice, the influence caused by the reading interference may be reduced as much as possible, so as to perform highly reliable reading.

Figure 17:
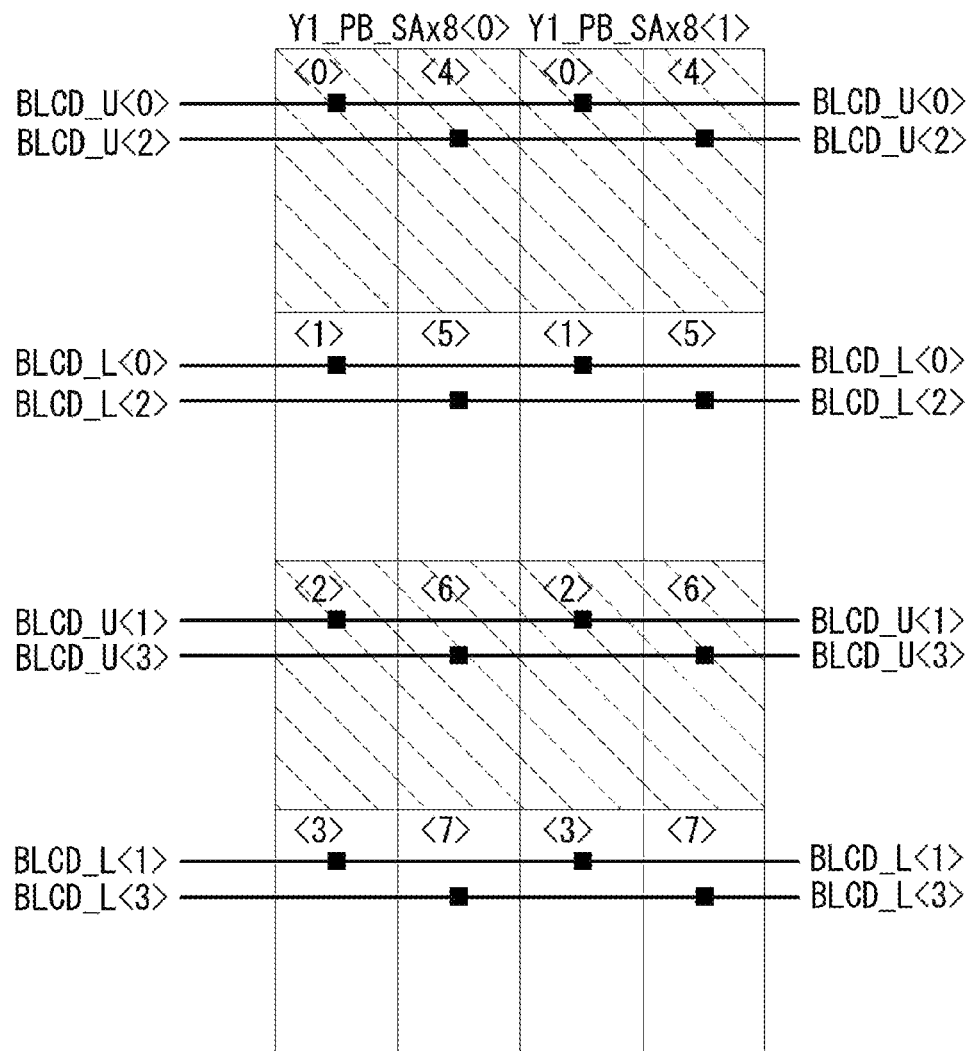
FIG. 17 is a diagram showing a connection relationship between page buffers/sensing circuits and wires used for driving transistors BLCD_U/BLCD_L of a comparative example.

Then, a comparative example of the embodiment is shown in FIG. 17-FIG. 22. FIG. 17 to FIG. 20 respectively correspond to FIG. 13 to FIG. 16, and FIG. 21 and FIG. 22 respectively correspond to FIG. 9 and FIG. 10B. In FIG. 17, in the comparative example, when the page buffers/sensing circuits are arranged in a 2-column×4-segment layout within a pitch, the page buffers/sensing circuits selected when reading the cache memory C0 are <0>, <4>, <2>, and <6> in the row direction, the page buffers/sensing circuits selected when reading the cache memory C1 are <1>, <5>, <3>, and <7> in the row direction. However, in the comparative example, "_U" and "_L" are not defined to belong to the cache memory C0 and the cache memory C1. In FIGS. 17, _U<0,1> and _L<1,0> belong to the cache memory C0, and _U<2,3> and _L<3,2> belong to the cache memory C1.

Figure 21:
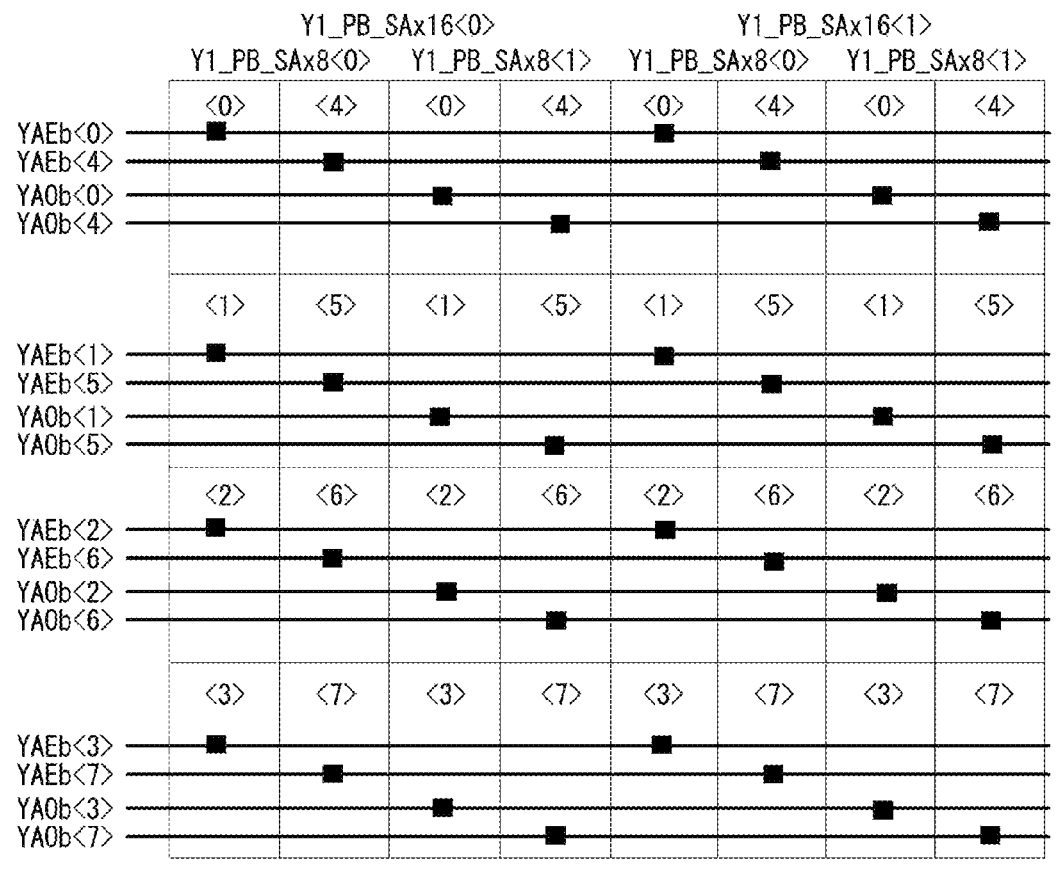
Figure 22:
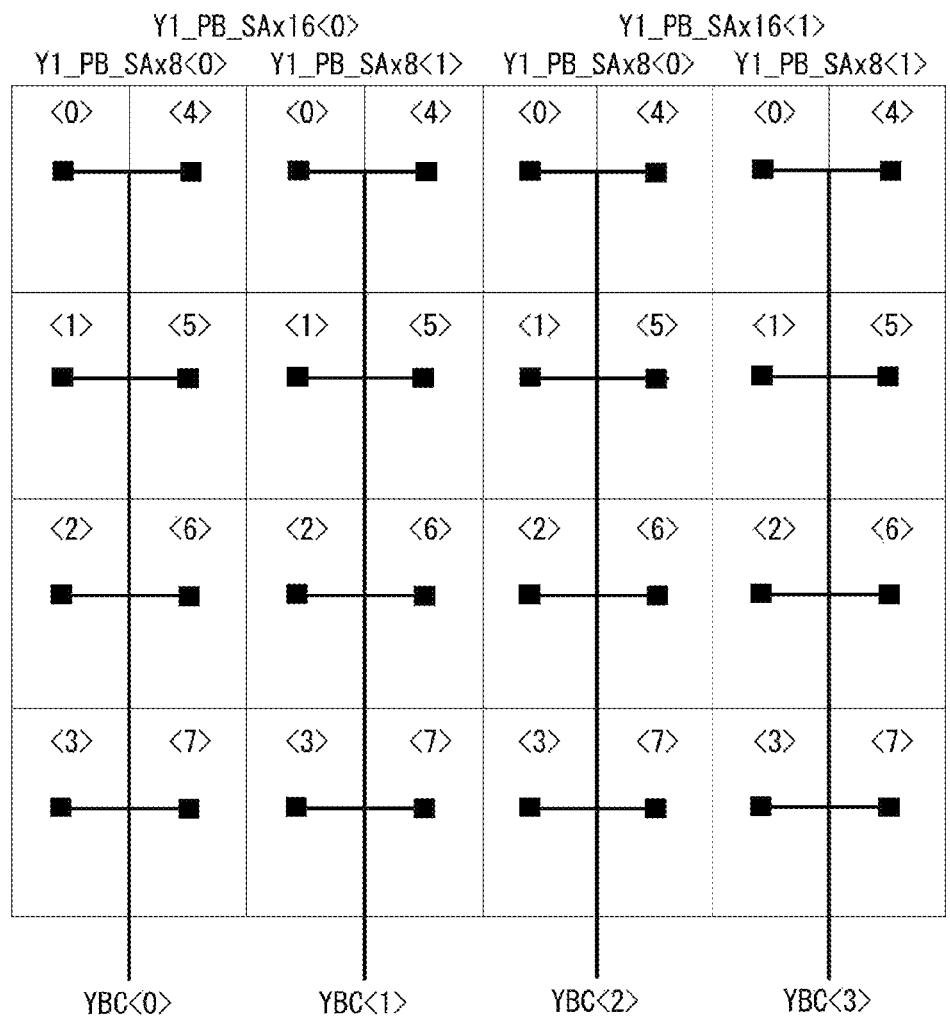
FIG. 22 is a diagram of selection performed by the page buffers/sensing circuits in the column direction when the cache memory C0 and the cache memory C1 are read according to the comparative example.

In the comparative example, as shown in FIG. 21, a YAEb signal <0> to a YAEb signal <7> and a YAOb signal <0> to a YAOb signal <7> generated from the column addresses are connected to any of the 16 page buffers/sensing circuits, and as shown in FIG. 22, the YBC<*> signals generated from the column addresses are commonly connected to 8 page buffers/sensing circuits <0> to <7>. Therefore, in the comparative example, the YAEb signals and the YAOb signals are used to select the page buffers/sensing circuits in the row direction, and the YBC signals are used to select the 8 page buffers/sensing circuits in the column direction. In the comparative example, the reading interference is not considered as that in the present embodiment. Therefore, in the reading operation of the cache memory C0 or the cache memory C1, adjacent page buffers/sensing circuits are simultaneously selected. For example, in the reading operation of the cache memory C0, the page buffer/sensing circuit <0>, the page buffer/sensing circuit <2>, the page buffer/sensing circuit <4>, and the page buffer/sensing circuit <6> are selected as described later, and the selected page buffers/sensing circuits are adjacent in the row direction.

On the other hand, in the embodiment, as shown in FIG. 9, FIG. 10A, and FIG. 10B, the YAEb signal <0> to the YAEb signal <7> or the YAOb signal <0> to the YAOb signal <7> are alternately connected to 16 page buffers/sensing circuits, respectively, and one YAEb signal or one YAOb signal is commonly connected to two page buffers/sensing circuits located adjacent to each other in the row direction. For example, the YAEb signal <0> is connected to the page buffer/sensing circuit <0>and the page buffer/sensing circuit <4>, and the YAOb signal <0>is connected to <0> and <4> in the adjacent 16 page buffers/sensing circuits. Moreover, the YBC signal used for identifying the cache memory C0 or the cache memory C1 is applied to select any one of a pair of adjacent page buffers/sensing circuits selected by one YAEb signal or one YAOb signal. In this way, in the embodiment, remapping of the page buffer/sensing circuit selected by using the YAEb/YAOb signal and the YBC signal is performed. As a result, when the cache memory C0 and the cache memory C1 are read, any one of a pair of page buffers/sensing circuits of a pair of cache memory C0 and cache memory C1 adjacent in the row direction is selected, so as to suppress the influence of reading interference caused by reading a same page multiple times.

Figure 18:
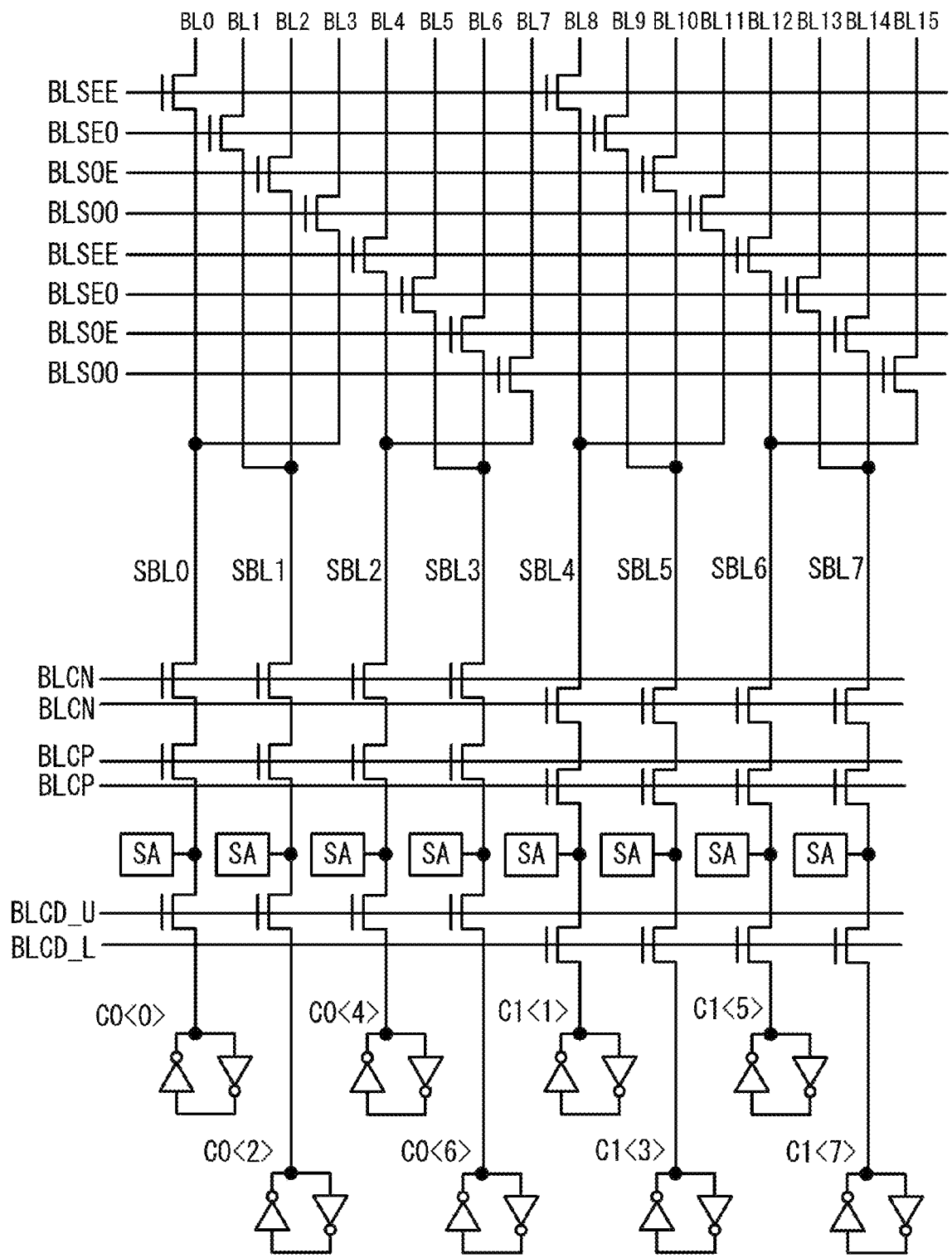
FIG. 18 is a diagram showing an electrical connection relationship between page buffers/sensing circuits and bit lines of the comparative example.
Figure 20:
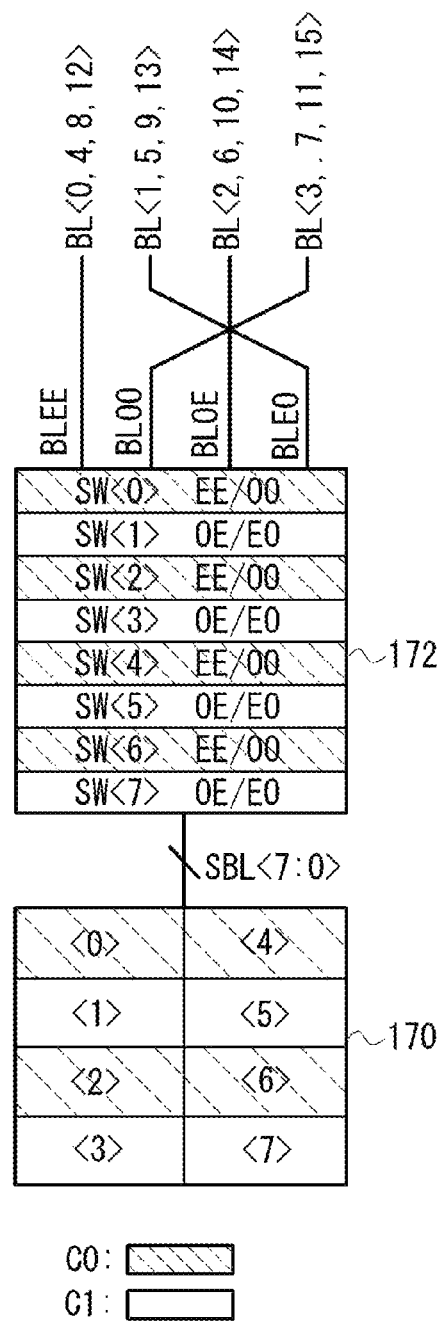
FIG. 20 is a diagram showing a connection relationship between sub-bit lines and each switch (selected transistor) of a bit line selection circuit of the comparative example.

As shown in FIG. 18, FIG. 19A and FIG. 19B, the sub-bit line SBL0, the sub-bit line SBL1, the sub-bit line SBL2, and the sub-bit line SBL3 belong to the cache memory C0, and the sub-bit line SBL4, the sub-bit line SBL5, the sub-bit line SBL6, and sub-bit line SBL7 belong to the cache memory C1. FIG. 20 shows a connection relationship between the bit line selection circuit and the page buffers/sensing circuits. Similar to the aforementioned embodiments, the bit line selection circuit selectively turns on the transistor BLSEE when reading the even-numbered pages of the cache memory C0, selectively turns on the transistor BLSOO when reading the odd-numbered pages of the cache memory C0, selectively turns on the transistor BLSOE when reading the even-numbered pages of the cache memory C1, and selectively turns on the transistor BLSEO when reading the odd-numbered pages of the cache memory C1.

Therefore, as shown in FIG. 19B, when the even-numbered pages of the cache memory C0 are read, the bit line BL0, the bit line BL2, the bit line BL4, and the bit line BL6 are selected. When the odd-numbered pages are read, the bit line BL1, the bit line BL3, the bit line BL5, and the bit line BL7 are selected. When the even-numbered pages of cache memory C1 are read, the bit line BL8, the bit line BL10, the bit line BL12, and the bit line BL16 are selected. When the odd-numbered pages are read, the bit line BL9, the bit line BL11, the bit line BL13, and the bit line BL15 are selected. The non-selected bit lines are electrically connected to the GND level through the virtual power supply of the bit line selection circuit 172. In addition, in the comparative example shown in FIG. 20, since the sub-bit lines SBL<7:0> have different allocations to the page buffers/sensing circuits, the sub-bit lines shown in FIG. 16 are scrambled.

Therefore, in the comparative example, when the cache memory C0 and the cache memory C1 are read, as literally, the even-numbered bit lines or the odd-numbered bit lines are simultaneously selected, in other words, a non-selected bit line connected to the GND level is provided between the selected bit lines, thereby suppressing the FG coupling between the selected bit lines. When a space between the bit lines becomes narrower, a coupling ratio becomes higher, so that when the same page is read twice in succession, to use one non-selected bit line cannot sufficiently suppress the FG coupling, which may probably cause reading interference.

It will be apparent to those skilled in the art that various modifications and variations can be made to the disclosed embodiments without departing from the scope or spirit of the disclosure.

What is claimed is:

1. A continuous reading method, adapted for a flash memory, wherein
performing reading twice to respectively read first page data and second page data from the same page of a memory cell array;
when the first page data of a first page of the memory cell array is read through one of selected bit lines, two or more non-selected bit lines connected to a ground level are provided between the selected bit lines,
when the second page data of the first page of the memory cell array is read through another one of selected bit lines, two or more non-selected bit lines connected to the ground level are provided between the selected bit lines, and
each of the first page data and the second page data read out from a plurality of selected pages is continuously outputted.

2. The continuous reading method according to in claim 1, wherein when the first page data or the second page data of the first page of the memory cell array is read, three non-selected bit lines connected to the ground level are provided between the selected bit lines.

3. The continuous reading method according to claim 1, wherein reading of the first page data comprises reading of an even-numbered page and reading of an odd-numbered page,
when the even-numbered page of the first page data is read, an even-numbered bit line is selected, and when the odd-numbered page of the first page data is read, an odd-numbered bit line is selected.

4. The continuous reading method according to claim 3, wherein reading of the second page data comprises reading of an even-numbered page and reading of an odd-numbered page,
when the even-numbered page of the second page data is read, an even-numbered bit line is selected, and when the odd-numbered page of the second page data is read, an odd-numbered bit line is selected.

5. The continuous reading method according to claim 1, wherein the first page data and the second page data read from the storage cell array are respectively held in a first holding region and a second holding region of a data holding portion of a page buffer/sensing circuit.

6. The continuous reading method according to in claim 5, wherein
after outputting the first page data of the first page held in the first holding region, while outputting the second page data of the first page held in the second holding region, first page data of a second page next to the first page is read from the memory cell array, and the read first page data is held in the first holding region,
after outputting the second page data of the first page held in the second holding region, while outputting the first page data of the second page held in the first holding region, second page data of the second page is read from the memory cell array, and the read second page data is held in the second holding region.

7. The continuous reading method according to in claim 5, wherein the first page data and the second page data held in the first holding region and the second holding region are continuously output to the outside in synchronization with a clock signal.

8. The continuous reading method according to in claim 1, wherein reading of the first page data comprises reading of an even-numbered page and reading of an odd-numbered page, and reading of the second page data comprises reading of an even-numbered page and reading of an odd-numbered page,
when an even-numbered page or an odd-numbered page is read, two or more non-selected bit lines connected to the ground level are provided between the selected bit lines.

9. The continuous reading method according to in claim 1, wherein each of the first page data and the second page data is ½ page data continuous in a column address direction of the selected pages of the memory cell array.

10. The continuous reading method according to in claim 1, wherein the first page data includes main region data used for storing data, and the second page data includes main region data and spare region data.

11. A semiconductor device, comprising:
a memory cell array;
a page buffer/sensing circuit, connected to each of bit lines of the memory cell array;
a reading component, reading a selected page of the memory cell array; and
an output component, outputting data read by the reading component, wherein
when the reading component performs continuous reading of a plurality of pages, performing reading twice to respectively read first page data and second page data from the same page of the memory cell array, when the first page data of the selected page of the memory cell array is read through one of selected bit lines, two or more non-selected bit lines connected to a ground level are provided between the selected bit lines, and when the second page data of the selected page of the memory cell array is read through another one of selected bit lines, two or more non-selected bit lines connected to the ground level are provided between the selected bit lines.

12. The semiconductor device according to claim 11, wherein the page buffer/sensing circuit comprises a layout of a plurality of 2-column×m-row in a row direction, when the first page data is read, the page buffer/sensing circuit of a first column is selected for operation, and when the second page data is read, the page buffer/sensing circuit of a second column is selected for operation.

13. The semiconductor device according to claim 12, wherein two adjacent page buffers/sensing circuits are respectively connected to corresponding sub-bit lines through a corresponding charge transfer transistor, a corresponding transistor that clamp a potential of the bit lines, and a corresponding transistor connected to the sub-bit lines, wherein each of the sub-bit lines is connected to an even-numbered bit line and an odd-numbered bit line through a corresponding bit line selection circuit.

14. The semiconductor device according to claim 11, wherein one page buffer/sensing circuit is connected to an even-numbered bit line and an odd-numbered bit line through a bit line selection circuit, and when an even-numbered page or an odd-numbered page is read, two or more non-selected bit lines connected to the ground level are provided between the selected bit lines.

15. The semiconductor device according to claim 11, wherein the page buffer/sensing circuit comprises a data holding portion, and the data holding portion comprises: a first holding region for holding the first page data read from the memory cell array and a second holding region for holding the second page data.

16. The semiconductor device according to in claim 15, wherein
after outputting the first page data of the first page held in the first holding region, while outputting the second page data of the first page held in the second holding region, first page data of a second page next to the first page is read from the memory cell array, and the read first page data is held in the first holding region,
after outputting the second page data of the first page held in the second holding region, while outputting the first page data of the second page held in the first holding region, second page data of the second page is read from the memory cell array, and the read second page data is held in the second holding region.

17. The semiconductor device according to claim 11, comprising:
a plurality of first transistors, connected to a page buffer/sensing circuit selected when the first page data is read; and
a plurality of second transistors, connected to a page buffer/sensing circuit selected when the second page data is read, the page buffer/sensing circuit connected to the first transistors and the page buffer/sensing circuit connected to the second transistors are repeatedly arranged in a row direction.

18. The semiconductor device according to in claim 11, wherein each of the first page data and the second page data is ½ page data continuous a column address direction of the selected page of the memory cell array.

19. A continuous reading method, adapted for a flash memory, wherein
when first page data of a first page of a memory cell array is read through one of selected bit lines, two or more non-selected bit lines connected to a ground level are provided between the selected bit lines,
when second page data of the first page of the memory cell array is read through another one of selected bit lines, two or more non-selected bit lines connected to the ground level are provided between the selected bit lines, and
each of the first page data and the second page data read out from a plurality of selected pages is continuously outputted,
wherein the first page data includes main region data used for storing data, and the second page data includes main region data and spare region data.

20. The continuous reading method, comprising performing reading twice to respectively read first page data and second page data from the same page of a memory cell array.

* * * * *